(12) United States Patent
Son

(10) Patent No.: US 8,623,173 B2
(45) Date of Patent: Jan. 7, 2014

(54) SUBSTRATE PROCESSING APPARATUS HAVING ELECTRODE MEMBER

(75) Inventor: Hyoung-Kyu Son, Seongnam-si (KR)

(73) Assignee: Advanced Display Process Engineering Co., Ltd., Seongnam-Si (KR)

( * ) Notice: Subject to any disclaimer, the term of this patent is extended or adjusted under 35 U.S.C. 154(b) by 1290 days.

(21) Appl. No.: 12/146,790

(22) Filed: Jun. 26, 2008

(65) Prior Publication Data

US 2009/0071524 A1   Mar. 19, 2009

(30) Foreign Application Priority Data

Sep. 14, 2007 (KR) .................. 10-2007-0093859
Sep. 14, 2007 (KR) .................. 10-2007-0093860

(51) Int. Cl.
  *C23C 16/00*  (2006.01)
  *H01L 21/306*  (2006.01)
  *F25B 21/02*  (2006.01)

(52) U.S. Cl.
  USPC ............ 156/345.53; 156/345.52; 156/345.27; 118/724; 118/725; 62/3.2

(58) Field of Classification Search
  None
  See application file for complete search history.

(56) References Cited

U.S. PATENT DOCUMENTS

| | | | | |
|---|---|---|---|---|
| 2,229,940 A | * | 1/1941 | Spofford | 62/525 |
| 5,584,183 A | * | 12/1996 | Wright et al. | 62/3.7 |
| 5,901,030 A | * | 5/1999 | Logan et al. | 279/128 |
| 6,322,626 B1 | * | 11/2001 | Shirley | 118/73 |
| 6,432,208 B1 | * | 8/2002 | Kawakami et al. | 118/728 |
| 6,634,177 B2 | * | 10/2003 | Lin et al. | 62/3.2 |
| 6,685,467 B1 | * | 2/2004 | Subramanian | 432/253 |
| 6,891,263 B2 | * | 5/2005 | Hiramatsu et al. | 257/703 |
| 7,141,763 B2 | * | 11/2006 | Moroz | 219/390 |
| 7,978,963 B2 | * | 7/2011 | Shimizu et al. | 392/411 |

FOREIGN PATENT DOCUMENTS

| | | |
|---|---|---|
| CN | 1802066 A | 7/2006 |
| CN | 1943008 | 4/2007 |
| EP | 1 835 551 | 9/2007 |
| JP | 2004-259829 | 9/2004 |
| JP | 2004259829 | * 9/2004 |
| JP | 2006-190916 | 7/2006 |
| KR | 10-1999-0065344 | 8/1999 |
| KR | 10-2004-0106971 | 12/2004 |
| KR | 10-2006-0076851 | 7/2006 |
| KR | 10-2007-0041220 | 4/2007 |
| WO | WO 2006/067986 | 6/2006 |

\* cited by examiner

*Primary Examiner* — Dah-Wei Yuan
*Assistant Examiner* — Binu Thomas
(74) *Attorney, Agent, or Firm* — KED & Associates LLP

(57) ABSTRACT

An electrode member for generating plasma includes an electrode plate and a cooling unit having a plurality of thermoelectric modules that are thermally in contact with the electrode plate. The thermoelectric modules may regulate the temperature of the electrode plate based on the Peltier effect.

4 Claims, 11 Drawing Sheets

SUBSTRATE PROCESSING APPARATUS HAVING ELECTRODE MEMBER

BACKGROUND

1. Field

One or more embodiments described herein relate to processing substrates including semiconductor substrates.

2. Background

In a semiconductor manufacturing process, a desired pattern is formed on a wafer by selectively removing thin films deposited through etching. The thin films may include silicon dioxide films, silicon nitride films, or photoresists. The oxide and nitride film allow for better etching. However, improvements in semiconductor substrate processing are still required.

DETAILED DESCRIPTION

One type of plasma etching apparatus includes a shower head provided at an upper part of a susceptor. The susceptor supports a wafer in a process chamber and the shower head includes a plurality of gas feeding holes. In this arrangement, a lower surface of the shower head is used as an upper electrode and the susceptor is used as a lower electrode.

During processing, a high frequency is provided by an RF generator between the upper and lower electrodes to generate a plasma, and a source gas is supplied in the process chamber from the shower head. A process such as etching (or deposition) is then performed using the plasma. The effectiveness of this and other semiconductor processes depend, in part, on temperatures of the process chamber, upper electrode, and lower electrode. It is often the case that the temperatures of the upper and lower electrodes increase because the wafer is placed on the lower electrode and the upper electrode is directly exposed to the plasma during the plasma process.

Figure 1:
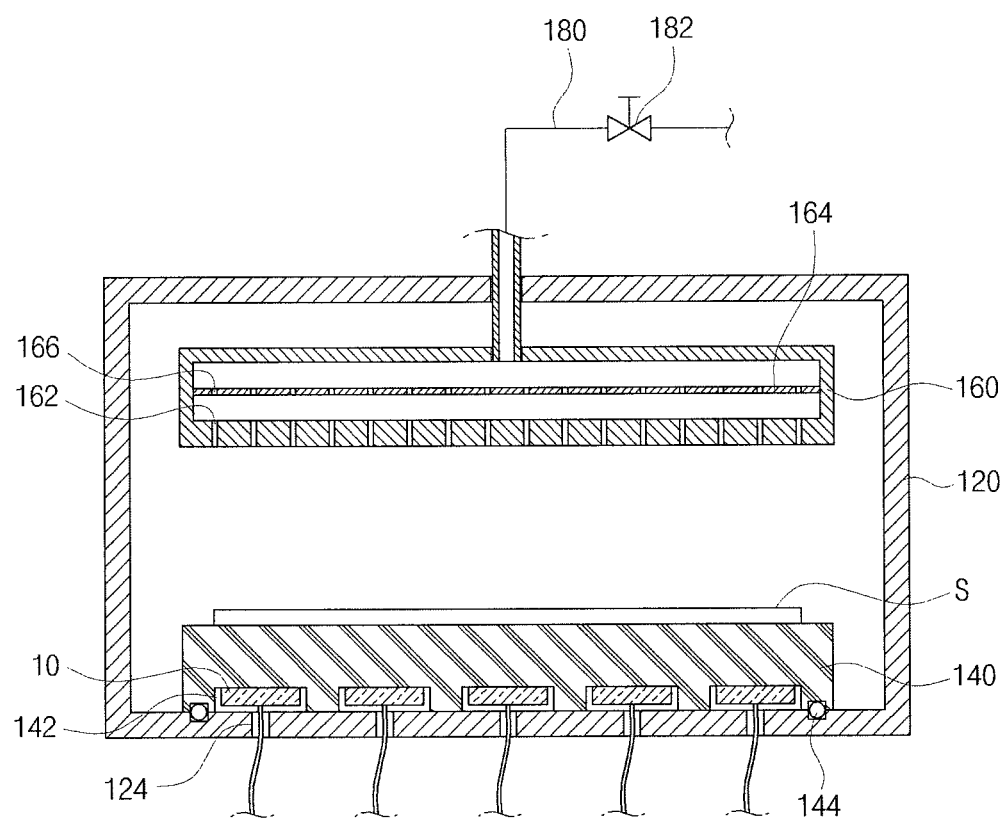
FIG. 1 is a diagram showing one embodiment of a substrate processing apparatus.

FIG. 1 shows one embodiment of a substrate processing apparatus that may improve the processing of substrates. This apparatus includes a process chamber 120, a shower head 160 at an upper part of the process chamber to supply source gas, and an electrode plate 140 at a lower part facing the shower head. A substrate (S) is placed on the electrode plate 140.

In addition, a supply line 180 is connected to an upper part of the shower head and source gas is supplied into a vacant space in the shower head through the supply line. The supply line is opened and closed by a valve 182.

The shower head includes a diffusion plate 164 that divides an inside of the shower head into two spaces. Source gas supplied through the supply line flows in the upper part of the diffusion plate and is diffused below the diffusion plate through a plurality of diffusion holes 166. A plurality of spray nozzles 162 are formed at a lower surface of the shower head and the diffused source gas is supplied between the shower head and electrode plate through the spray nozzles.

The shower head 160 is preferably used as an upper electrode for generating plasma, and a high frequency is applied to the shower head from an RF generator (operating, for example, at 13.56 MHz).

The electrode plate 140 is provided on a bottom surface of the process chamber 120, and substrate (S) is placed on an upper surface of the electrode plate. A plurality of installation holes 142 are formed on the bottom surface of the electrode plate and a thermoelectric module 10 is installed in each installation hole.

A sealing member 144 is provided at an edge of the bottom surface of the electrode plate to seal the bottom surfaces of the electrode plate and process chamber. The thermoelectric module may be shielded from plasma formed at the upper part of the electrode plate. A plurality of through-holes 124 are formed on the bottom surface of the process chamber. The bottom surface is provided under the installation holes. Wires for applying power to the thermoelectric modules are connected respectively through the through-holes 124.

The electrode plate 140 is used as a lower electrode for generating plasma and is grounded. An electric field is formed between the shower head 160 and electrode plate 140 and plasma is generated from the source gas supplied through the supply hole 162 of the shower head.

Figure 2:
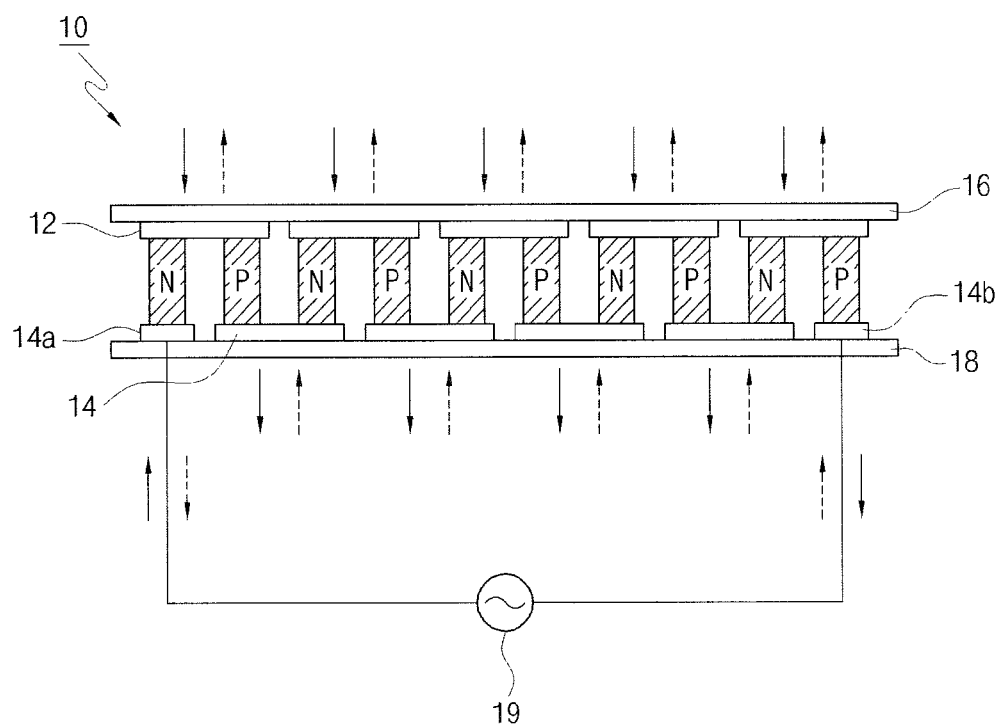
FIG. 2 is a diagram showing a thermoelectric module of FIG. 1.

FIG. 2 shows one type of thermoelectric module that may be used in the apparatus of FIG. 1. The thermoelectric module is inserted into an installation hole 142 to control a temperature of the electrode plate 140. The thermoelectric module includes a plurality of thermoelectric elements (N, P) that are heated or cooled, for example, by the Peltier effect. The Peltier effect is a phenomenon where one bonding part of a circuit formed of two different metals is cooled and the other part is heated when current flows through the circuit. When a direction of the current is changed, the cooled and heated parts are exchanged.

The thermoelectric elements (N, P) may be arranged in a direction parallel to the upper and lower insulation plates 16 and 18, that are arranged in parallel and below the thermoelectric elements. The N-type and P-type thermoelectric elements are alternatively arranged and connected to each other through first and second heat transfer plates 12 and 14.

Referring to FIG. 2, the first heat transfer plate 12 is connected to upper parts of the thermoelectric elements (N, P) and the second heat transfer plate 14 is connected to lower parts of the thermoelectric elements. An upper end of the N-type thermoelectric element is connected to one side of the first heat transfer plate and an upper end of the P-type thermoelectric element is connected to the other side of the first heat transfer plate. The upper end of the P-type thermoelectric element connected to the other side of the first heat transfer plate is connected to one side of the second heat transfer plate, and other N-type thermoelectric element is connected to the other side of the second heat transfer plate.

The thermoelectric elements are preferably alternatively arranged in parallel with the upper and lower insulation plates 16 and 18 and connected to each other by repetition of the first and second heat transfer plates 12 and 14. As previously described, the first and second heat transfer plates may be cooled or heated by the Peltier effect. It may therefore be desirable to use material having a high heat transfer coefficient to cool or heat the first and second heat transfer plates.

Additionally, a lower end of the N-type thermoelectric element located at the left end is connected to a left terminal 14a and a lower end of the P-type thermoelectric element located at the right end is connected to a right terminal 14b. A power supply 19 is connected to the left and right terminals. Thus, a closed circuit is formed by the thermoelectric elements (N, P), first and second heat transfer plates, and the power supply. A direct current (DC) power supply for applying current in one direction may be used as the power supply, and an additional controller connected to the power supply may convert the current direction clockwise or counterclockwise.

The upper insulation plate 16 is provided on the first heat transfer plate 12 and the lower insulation plate 218 is provided under the second heat transfer plate 14. Any one of the upper and lower insulation plates contacts a cooling line to control a temperature of refrigerant flowing through the cooling line. The upper and lower insulation plates may be made of an insulating material. Heat transfer of the thermoelectric module 10 is conducted through the upper and lower insulation plates 16 and 18. It is desirable that the upper and lower insulation plates are made of an insulating material having high heat transfer coefficient.

One embodiment of a method for controlling the temperature of the electrode plate 140 by the thermoelectric module 10 will now be explained. Here, it is assumed that the first heat transfer plate 12 is in contact with electrode plate 140.

When current is applied clockwise (direction of solid line) from the power supply 219, the current is applied to the N-type thermoelectric element (N) through the left terminal 14a and applied to the P-type thermoelectric element (P) through the first heat transfer plate 12. The current is then applied to the N-type thermoelectric element (N) through the second heat transfer plate 14. Current, therefore, flows through this series of operations.

More specifically, when the first heat transfer plate 12 is taken as a reference, current flows from the N-type thermoelectric element (N) to the P-type thermoelectric element (P). Accordingly, the first heat transfer plate 12 is cooled by the Peltier effect. When the second heat transfer plate 14 is taken as the reference, the current flows from the P-type thermoelectric element (P) to the N-type thermoelectric element (N). Accordingly, the second heat transfer plate 14 is heated by the Peltier effect. The first heat transfer plate 12 absorbs heat of the electrode plate 140 through the upper insulation plate 216 (direction of solid line), and the second heat transfer plate 14 discharges heat to the outside (direction of solid line). Thus, the electrode plate 140 is cooled.

In one or more embodiments, the plurality of thermoelectric modules 10 can be independently controlled. Temperature distribution of the electrode plate 140 can be controlled by controlling each thermoelectric module independently (for example, the temperature distribution is kept constant or desired temperature distribution is formed). Cooling efficiency (or cooling speed) of each thermoelectric module can be controlled by controlling current applied to the thermoelectric module. Accordingly, the temperature distribution can be controlled. In addition, a controller (not shown) may be included to perform the above described control.

When current is applied counterclockwise (direction of dotted line) from the power supply 19, the current flows from the P-type thermoelectric element (P) to the N-type thermoelectric element (N), taking the first heat transfer plate 12 as a reference. Accordingly, the first heat transfer plate 12 is heated by the Peltier effect.

When the second heat transfer plate 14 is taken as a reference, current flows from the N-type thermoelectric element (N) to the P-type thermoelectric element (P). Accordingly, the second heat transfer plate is cooled by the Peltier effect. The second heat transfer plate absorbs heat from the outside through the lower insulation plate 218 (direction of dotted line), and the first heat transfer plate transfers heat to the electrode plate 140 through the upper insulation plate 216 (direction of dotted line). Thus, the electrode plate 140 is heated.

Figure 3:
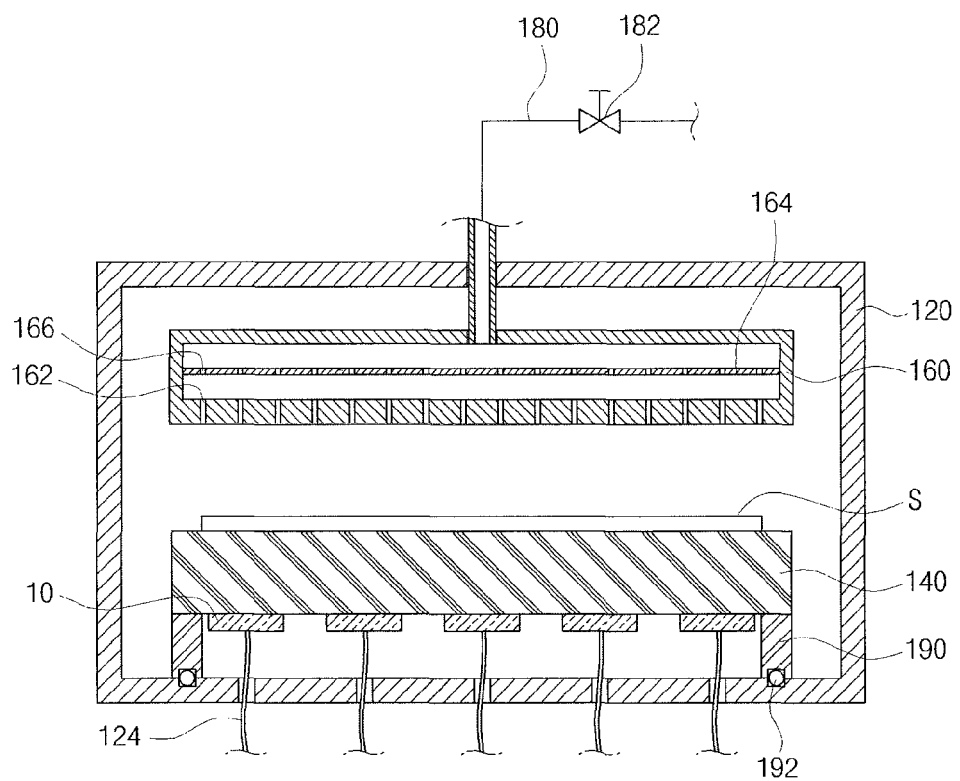
FIG. 3 is a diagram showing a second embodiment of a substrate processing apparatus.

FIG. 3 shows a second embodiment of a substrate processing apparatus. Like numerals are given like reference numerals, and elements different from those of the first embodiment will be explained.

In the second embodiment, thermoelectric modules 10 are arranged on a bottom surface of electrode plate 140 with a predetermined spacing. A substrate (S) is placed on the electrode plate, and the electrode plate is arranged to be spaced from a bottom surface of a process chamber 120. A support die 190 supports the electrode plate, e.g., an upper end of the support die supports the edge of the electrode plate and a lower end of the support die is in contact with the bottom surface of the process chamber. A sealing member 192 is provided between the lower end of the support die and the bottom surface of the process chamber to prevent plasma generated over the electrode plate from penetrating under the electrode plate 140.

Sufficient space can be secured under the electrode plate as a result of the electrode plate being spaced from the bottom surface of the process chamber. Accordingly, air can flow more smoothly under the electrode plate and thus heat irradiated from the thermoelectric module can be easily discharged to the outside.

Figure 4:
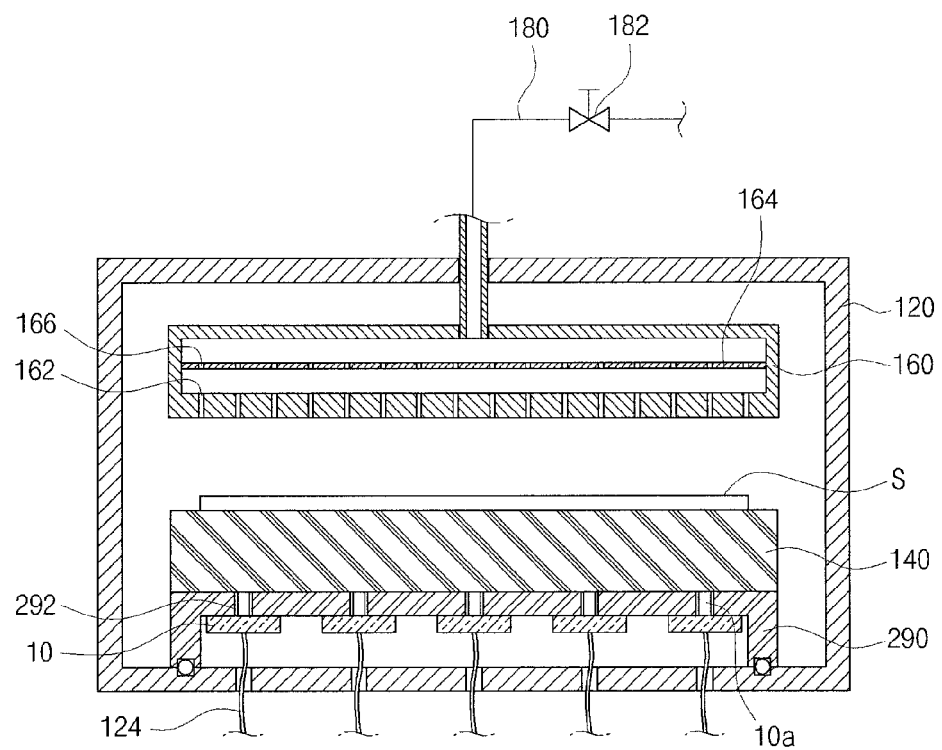
FIG. 4 is a diagram showing a third embodiment of a substrate processing apparatus.

FIG. 4 shows a third embodiment of a substrate processing apparatus. In this embodiment, electrode plate 140 is arranged to be spaced from a bottom surface of process chamber 120. The support die 290 supports the electrode plate, i.e., the support die 290 includes a horizontal part and a vertical part extended downward from the edge of the horizontal part, and the electrode plate 140 is placed on the horizontal part. The vertical part is in contact with the bottom surface of the process chamber.

Referring to FIG. 4, thermoelectric modules 10 are arranged on the bottom surface of the horizontal part with a predetermined space. The electrode plate 140 and plurality of thermoelectric modules are connected to each other through a plurality of fins 10a. The fins are respectively inserted into a plurality of through-holes 292 formed in support die 290. Heat transfer is conducted between the electrode plate and thermoelectric module through the fins.

Figure 5:
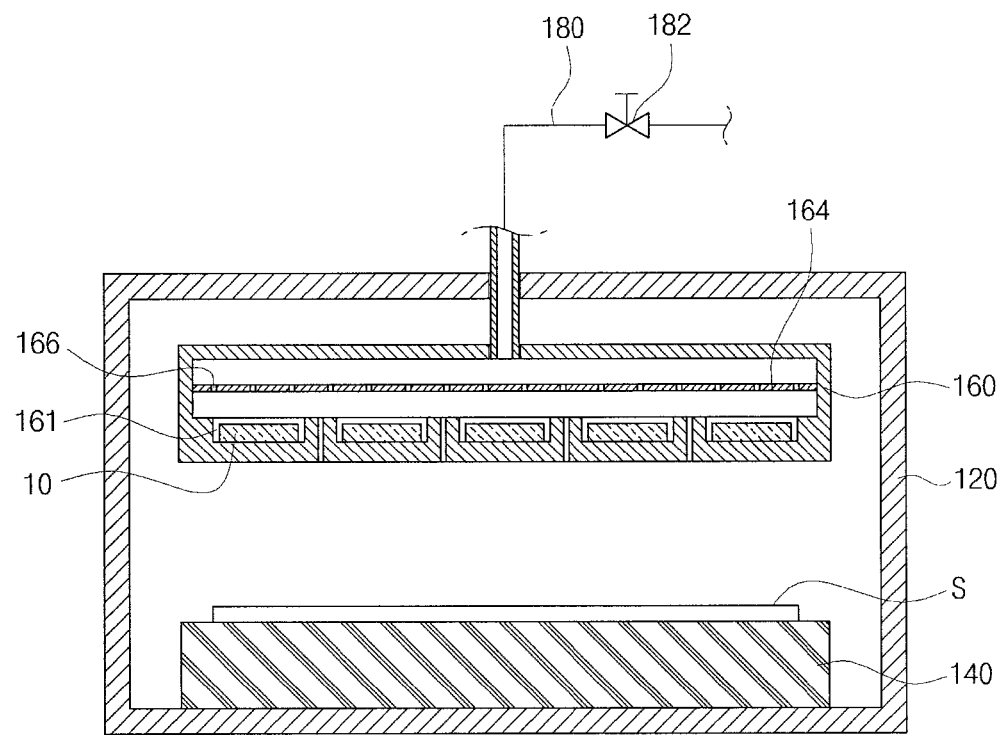
FIG. 5 is a diagram showing a fourth embodiment of a substrate processing apparatus.

FIG. 5 shows a fourth embodiment of a substrate processing apparatus. In this embodiment, thermoelectric modules 10 may be provided on shower head 160 to control (for example, cooling or heating) a temperature of a lower surface of the shower head that is directly exposed to plasma. A plurality of installation holes 161 are formed on the back surface of the shower head, and the thermoelectric modules may be installed in respective ones of the installation holes. The temperature of the shower head may be controlled by the thermoelectric modules in a same manner as the temperature control method of electrode plate 140 as previously explained.

Figure 6:
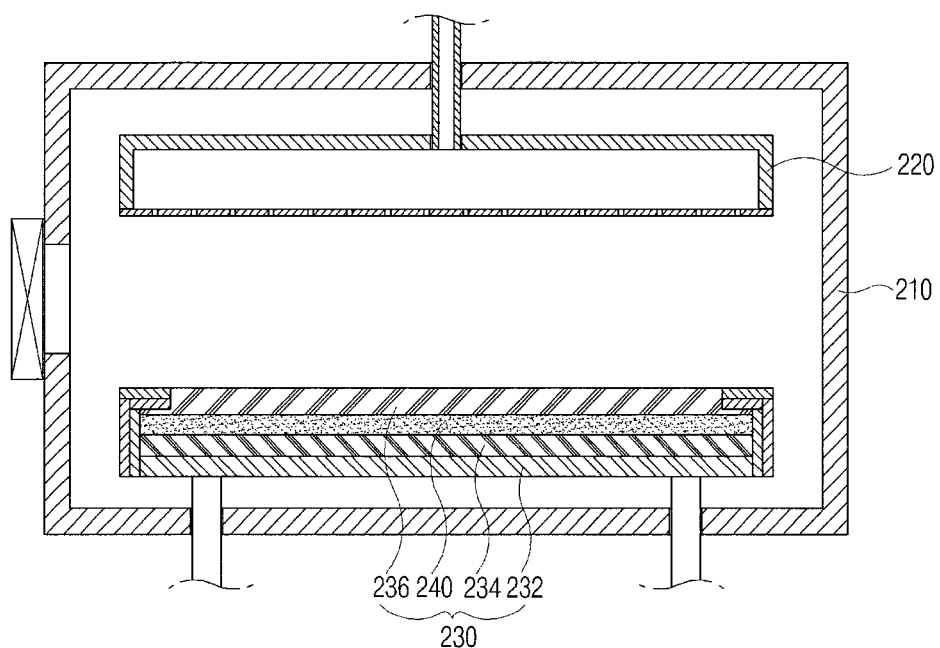
FIG. 6 is a diagram showing a fifth embodiment of a substrate processing apparatus.

FIG. 6 shows a fifth embodiment of a substrate processing apparatus, which includes a process chamber 210, an upper electrode 220 at an upper part inside the process chamber 210, and a lower electrode 230 at a lower part facing the upper electrode 220. Processes are performed in the process chamber 210 and process gas is supplied to upper electrode 220 and a substrate is placed on the lower electrode.

The lower electrode 230 includes a base plate 232 at the lowermost part, an insulation plate 234 provided on the base plate, a cooling block 240 provided on the insulation plate and an electrode 236 provided on the cooling block. Insulators surround an outer wall and an upper region of the lower electrode to protect the lower electrode from plasma. Here, the cooling block decreases the temperature of the electrode to keep the temperature constant.

Figure 7:
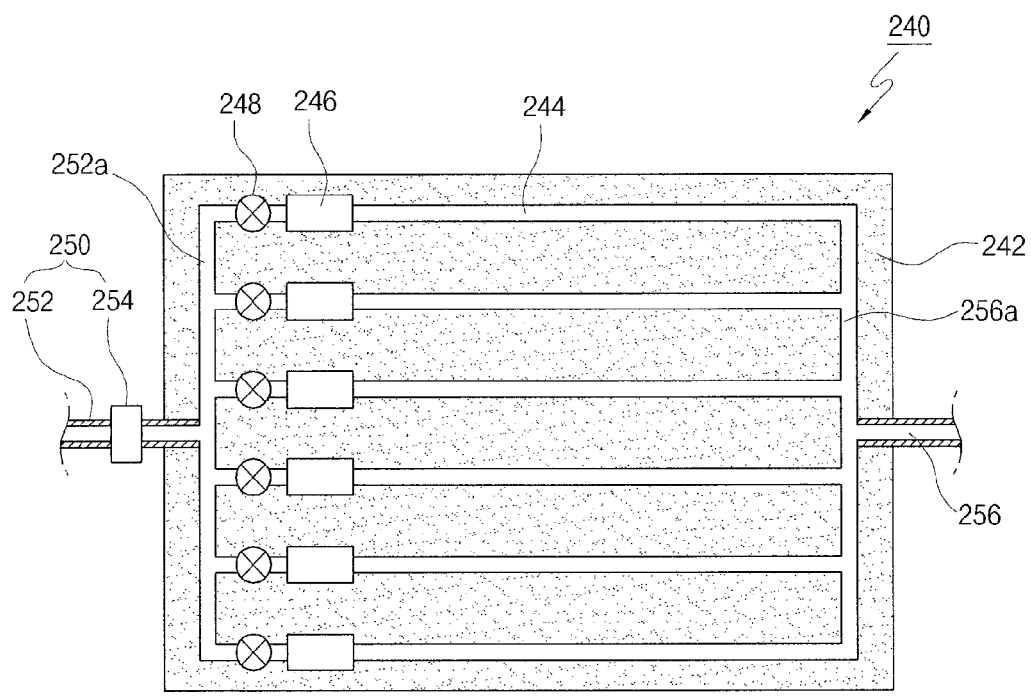
FIG. 7 is a diagram showing a cooling block in FIG. 6.

FIG. 7 is one example of cooling block 240 in FIG. 6. The cooling block includes a cooling plate 242 and a refrigerant flow path formed at the cooling plate. One end of the refrigerant flow path is connected to a supply unit 250, which supplies refrigerant into the cooling plate through the one end of the refrigerant flow path. The refrigerant is supplied into the cooling plate 242 through the one end of the refrigerant flow path, and is discharged out of the cooling plate through the other end of the refrigerant flow path.

The supply unit 250 includes a supply line 252 connected to a chiller and a mesh 254 formed on the supply line. The supply line is connected to one end of the refrigerant flow path, and supplies the refrigerant cooled at a predetermined temperature to the refrigerant flow path. The mesh 254 supports flow of the refrigerant flowing through the supply line.

The refrigerant flow path includes a branch line 252a connected to the supply line and a plurality of cooling lines 244 connected to the branch line. The cooling lines are preferably arranged in parallel in the cooling plate. When refrigerant flows through the cooling lines, the cooling lines 244 control the temperature of the cooling plate 242 by the refrigerant. The cooling lines are connected to branch line 256a and the branch line is connected to a discharge line 256.

A thermoelectric module 246 and a flow rate control valve 248 may be provided on the each cooling line. The flow rate control valve controls flow rate of refrigerant flowing through a corresponding one of the cooling lines. As shown in FIG. 2, the plurality of cooling lines may be arranged to be equally spaced in a vertical direction from the middle of the cooling plate 242 connected to the supply line 252. Cooling lines provided in the middle of the cooling plate may be arranged to be near the supply line 252. Accordingly, the refrigerant is supplied by relatively high pressure and cooling efficiency is high at the middle of the cooling plate 242.

However, the cooling lines provided at the edge of the cooling plate 242 are far from the supply line 252. According to this arrangement, there is a problem that the refrigerant is supplied by relatively low pressure and cooling efficiency is low at the edge of the cooling plate. To solve the above problem, flow rates of the cooling lines in the middle of the cooling plate may be increased and flow rates of the cooling lines at the edges of the cooling plate 242 may be decreased by controlling control valve 248.

In other words, flow rate control valve 248 can be controlled by sensing temperature difference according to positions of the cooling plate 242 (using an additional sensor provided on the cooling plate 242). The temperature difference can be controlled to be uniform by controlling valve 248.

The substrate processing apparatus may further include a controller for performing the above described control. Inner diameters of the cooling lines 244 for flow of the refrigerant are shown to be uniform in the drawings. However, the flow rate of the refrigerant may be controlled by changing the inner diameters of the cooling line 244 to be different from each other.

Figure 8:
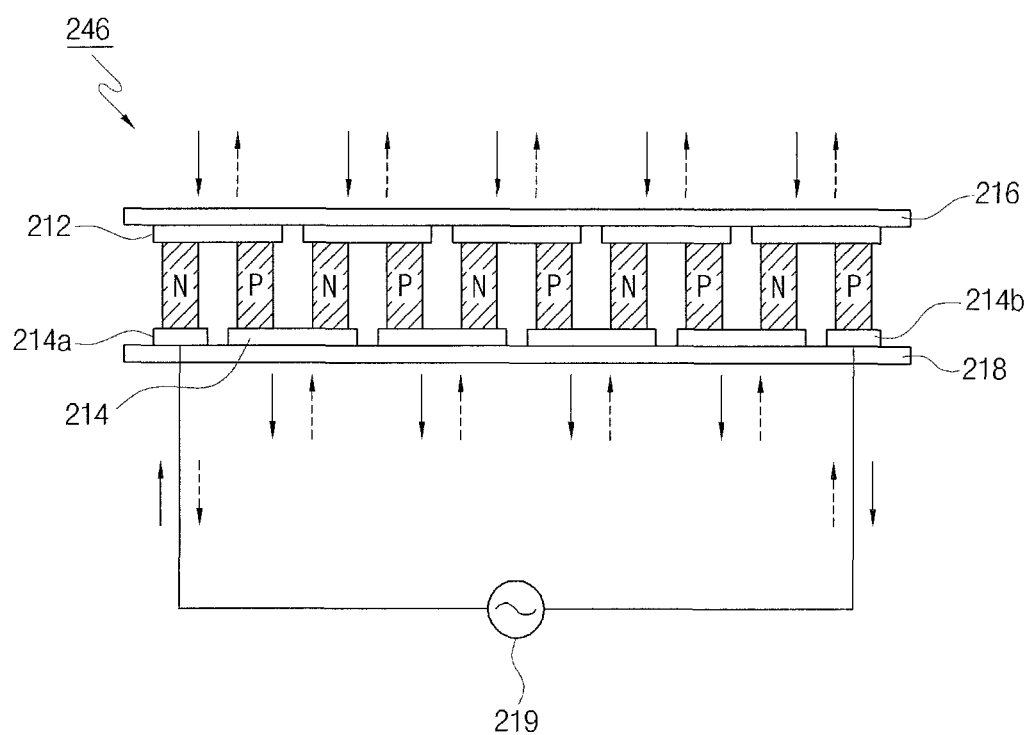
FIG. 8 is a diagram showing a thermoelectric module in FIG. 7.

FIG. 8 shows one example of a thermoelectric module 246 of FIG. 7. The thermoelectric module is provided in cooling plate 242 and in contact with an outer circumference surface of cooling line 244 (see, for example, FIG. 7 as well as other drawings), to control a temperature of the refrigerant flowing through the cooling line.

The thermoelectric module includes a plurality of thermoelectric elements (N, P). The thermoelectric elements N, P) may be heated or cooled by the Peltier effect. As previously explained, the Peltier effect is a phenomenon where one bonding part of a circuit formed of two different metals is cooled and the other part is heated when current flows through the circuit. When direction of the current is changed, the cooled and heated parts exchange functionality. The thermoelectric elements are arranged in a direction parallel to the upper and lower insulation plates 216 and 218, which are in parallel over and below the thermoelectric elements. The N-type and P-type elements are alternately arranged and are connected to each other through first and second heat transfer plates 212 and 214.

Referring to FIG. 8, the first heat transfer plate 212 is connected to upper parts of the thermoelectric elements (N, P) and the second heat transfer plate 214 is connected to lower parts of the thermoelectric elements. An upper end of N-type thermoelectric element is connected to one side of the first heat transfer plate, and an upper end of P type thermoelectric element is connected to the other side of the first heat transfer plate. The upper end of the P-type thermoelectric element is connected to one side of the second heat transfer plate, and the N-type thermoelectric element (N) is connected to the other side of the second heat transfer plate. The thermoelectric elements (N, P) are alternately arranged in parallel with the upper and lower insulation plates 216 and 218, and are connected to each other by repetition of the first and second heat transfer plates 212 and 214.

As described above, the first and second heat transfer plates 212 and 214 are cooled or heated by the Peltier effect. It is desirable that material having high heat transfer coefficient is used to cool or heat the first and second heat transfer plates.

On the other hand, a lower end of the N-type thermoelectric element at the left end is connected to a left terminal 214a and a lower end of the P at the right end is connected to a right terminal 214b. A power supply 219 is connected to the left and right terminals 214a and 214b. Thus, a closed circuit is formed by the thermoelectric elements, first and second heat transfer plates 212 and 214, and the power supply 219. A direct current (DC) power supply for applying current in one direction may be used as the power supply. An additional controller connected to the power supply may set the current direction to clockwise or counterclockwise.

The upper insulation plate 216 is provided on the first heat transfer plate 212 and the lower insulation plate 218 is provided under the second heat transfer plate 214. Any one of the upper or lower insulation plates 216 and 218 is in contact with a cooling line 244 to control a temperature of refrigerant flowing through the cooling line. The upper and lower insulation plates may be made of an insulating material.

Heat transfer of each thermoelectric module 246 may be performed through upper and lower insulation plates 216 and 218. It is desirable that the upper and lower insulation plates are made of an insulating material having high heat transfer coefficient.

A method of controlling the temperature of the refrigerant in the cooling line 244 by the thermoelectric module 246 will now be explained below. Here, it is assumed that the first heat transfer plate 212 is in contact with cooling line 244.

First, when current is applied clockwise (direction of solid line) from the power supply 219, the current is applied to the N-type thermoelectric element (N) through the left terminal 214a and applied to the P-type thermoelectric element (P) through the first heat transfer plate 212, and then applied to the N type thermoelectric element (N) through the second heat transfer plate 214. Thus, the current flows through this series of operations.

When the first heat transfer plate 212 is taken as a reference, the current flows from the N-type thermoelectric element to the P-type thermoelectric element. Accordingly, the first heat transfer plate is cooled by the Peltier effect. When the second heat transfer plate 214 is taken as the reference, the current flows from the P-type thermoelectric element to the N-type thermoelectric element. Accordingly, the second heat transfer plate is heated by the Peltier effect. The first heat transfer plate absorbs heat of the cooling line(s) 244 through the upper insulation plate 216 (direction of solid line), and the second heat transfer plate discharges heat to the outside of the cooling plate (direction of solid line) through the lower insulation plate 218. Thus, the refrigerant in the cooling line(s) 244 is cooled.

On the other hand, there is a problem that cooling efficiency is high at the middle of the cooling plate 242 but low at the edge thereof. This problem can be solved by using the thermoelectric module 246. In other words, the cooling efficiency of the edge of the cooling plate is relatively lower than the middle of the cooling plate. Thus, the cooling efficiency of the edge of the cooling plate can be increased by cooling the cooling lines at the edge of the cooling plate 242 at a temperature lower than that of the cooling lines in the middle of the cooling plate. The heat transfer rate is therefore considered to be proportional to temperature difference.

In other words, the temperature of the cooling lines can be controlled according to a temperature obtained by sensing a temperature difference based on a position of the cooling plate 242 (e.g., using an additional sensor provided on the cooling plate 242). Thus, the temperature difference of the cooling plate can be controlled to be uniform by controlling the temperature of the cooling lines. The substrate processing apparatus may include a controller for performing the above described control.

When current is applied counterclockwise (direction of dotted line) from the power supply 219, the current flows from the P-type thermoelectric element to the N-type thermoelectric element, taking first heat transfer plate 212 as a reference. Accordingly, the first heat transfer plate is heated by the Peltier effect. When the second heat transfer plate is taken as a reference, current flows from the N-type thermoelectric element to the P-type thermoelectric element. Accordingly, the second heat transfer plate is cooled by the Peltier effect. The second heat transfer plate absorbs heat from the outside through the lower insulation plate 218 (direction of dotted line), and the first heat transfer plate transfers heat to the cooling lines through the upper insulation plate 216 (direction of dotted line). Thus, the refrigerant flowing through the cooling lines is heated.

Figure 9:
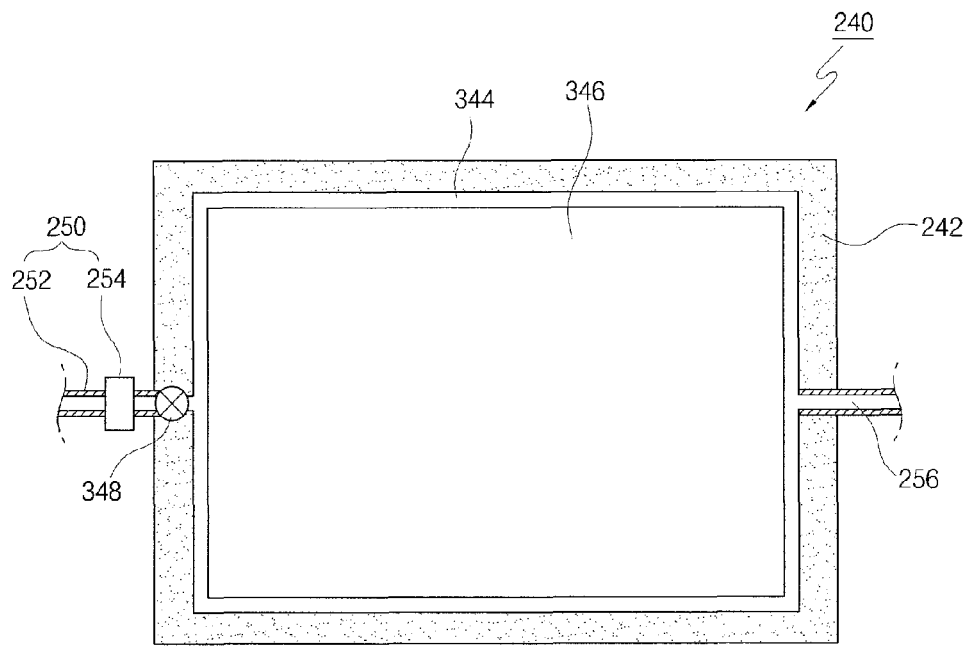
FIGS. 9 to 11 are diagrams showing other types cooling blocks.
Figure 10:
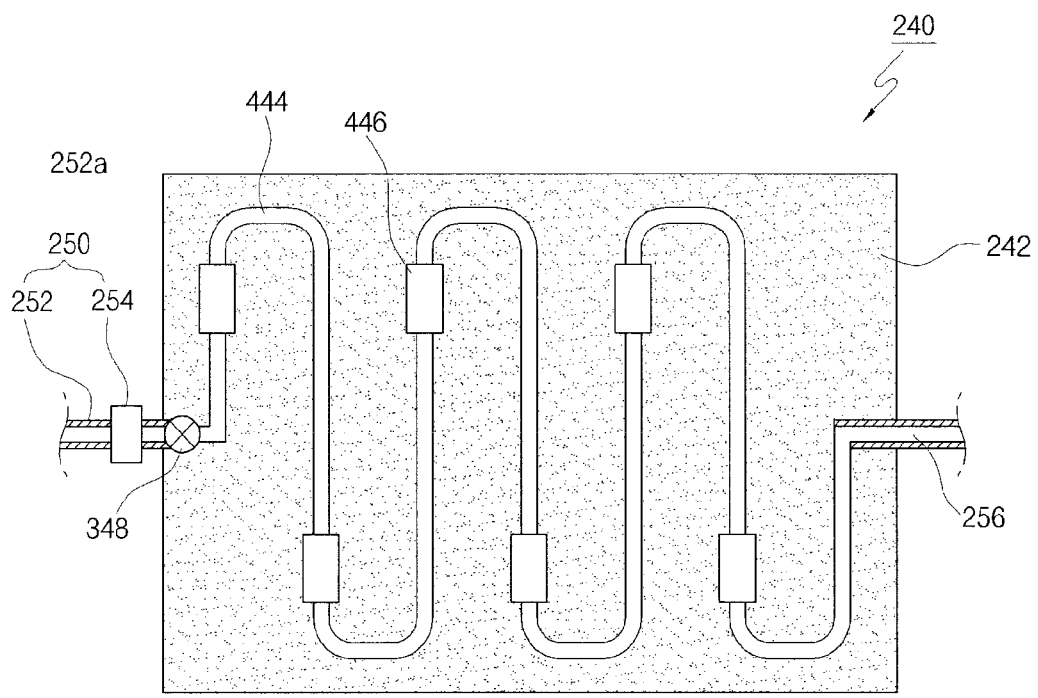
Figure 11:
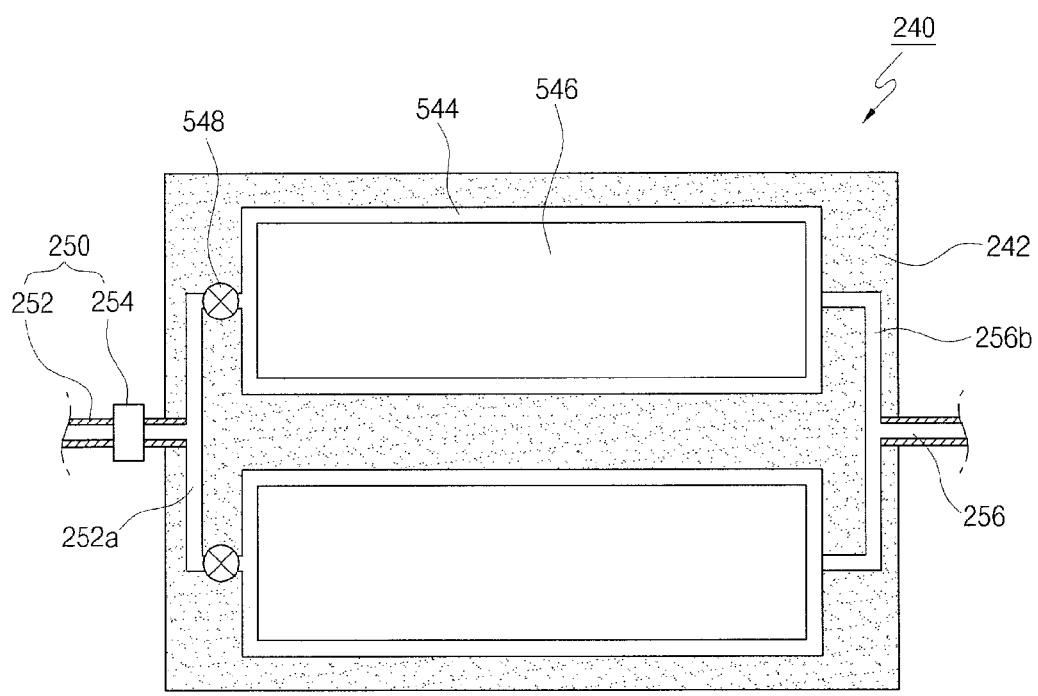

FIGS. 9 to 11 show different examples of the cooling block in FIG. 7. Referring to FIG. 9, a refrigerant flow path 344 has a rectangular shape corresponding to cooling plate 242. The refrigerant flow path is connected to supply line 252 and discharge line 256. Refrigerant flows through refrigerant flow path 344, which controls the temperature of the cooling plate through the refrigerant therein. The refrigerant filled in the refrigerant flow path can control the temperature distribution of the cooling plate to be uniform by self-convection. A flow rate control valve 348 is connected to supply line 252 to control the flow rate of the refrigerant supplied to refrigerant flow path 344. In addition, a thermoelectric module 346 is provided on the refrigerant flow path.

Referring to FIG. 10, a refrigerant flow path 444 has a zig-zag shape that extends over upper and lower parts of the cooling plate 242. The refrigerant flow path is connected to the supply line 252 and discharge line 256. As described above, refrigerant flows through the refrigerant flow path, which controls the temperature of the cooling plate through the refrigerant therein. The cooling efficiency of the cooling plate is increased according to an increase of a length of the refrigerant flow path that is in contact with the cooling plate. A thermoelectric module 446 is provided on the refrigerant flow path to keep a predetermined spacing with reference to the length of the refrigerant flow path. Uniform temperature distribution of the cooling plate can be secured by the space of the thermoelectric module 446.

Referring to FIG. 11, a refrigerant flow path 544 has a rectangular shape corresponding to a half of the cooling plate 242. The refrigerant flow path is connected to the branch lines 252a and 256a. As described above referring to FIG. 9, refrigerant flows through the refrigerant flow path, which controls the temperature of the cooling plate through the refrigerant therein. A thermoelectric module 546 may be provided on the refrigerant flow path 544 or on the branch line 252a.

One or more of the foregoing embodiments, therefore, provide a cooling block that can precisely control a temperature of a process chamber during semiconductor processing. These embodiments also provide a cooling block that can precisely control a temperature of upper or lower electrodes of a substrate processing apparatus. Moreover, these embodiments provide a cooling block that can generate a uniform temperature distribution of the upper or lower electrodes of a substrate processing apparatus.

According to one embodiment, an apparatus includes a n electrode plate and a cooling unit having a plurality of thermoelectric modules that are thermally contacted to the electrode plate. The electrode plate may include a front surface facing a plasma generation space and a rear surface facing the front surface, and the thermoelectric modules may be provided on the rear surface of the electrode plate. Installation holes may be formed to be depressed in the rear surface of the electrode plate and the thermoelectric modules may be installed in the installation holes.

The electrode member may further include a plurality of fins that connect the electrode plate to the thermoelectric modules respectively. The cooling unit may include a cooling plate and a cooling member controlling a temperature of the cooling plate, where the cooling plate includes refrigerant inlet and outlet and a plurality of refrigerant flow paths that are communicated with the refrigerant inlet and outlet, and the cooling member includes the thermoelectric modules. The cooling member may be provided outside the refrigerant flow path to be thermally contacted to the refrigerant flow path.

According to another embodiment, a substrate processing apparatus comprises a chamber having an internal space where processes are performed on a substrate; and an electrode member provided in the chamber to generate plasma in the internal space, where the electrode member includes an electrode plate; and a cooling unit having a plurality of thermoelectric modules that are thermally contacted to the electrode plate. The electrode plate may include a front surface facing a plasma generation space and a rear surface facing the front surface, and the thermoelectric modules may be provided on the rear surface of the electrode plate.

Installation holes may be formed to be depressed in the rear surface of the electrode plate and the thermoelectric modules may be installed in the installation holes. The substrate processing apparatus may further include a sealing member provided between the rear surface of the electrode plate and a bottom surface of the chamber.

The electrode member may further include a support die supporting the electrode plate. The electrode member may further include a plurality of fins that connect the electrode plate and thermoelectric modules respectively. The electrode member may further include a support die that supports the electrode plate and has a plurality of through-holes where the fins are inserted respectively.

The electrode member may be a lower electrode provided at a lower part inside the chamber, where the substrate is placed on the lower electrode. The electrode member may be a shower head provided at an upper part inside the chamber to supply source gas in the chamber.

The shower head may include a front surface facing a plasma generation space and a rear surface facing the front surface, and the thermoelectric modules may be provided on the rear surface of the electrode plate. Installation holes may be formed to be depressed in the rear surface of the shower head and the thermoelectric modules may be installed in the installation holes.

The electrode member may include a cooling plate and a cooling member controlling a temperature of the cooling plate, where the cooling plate includes refrigerant inlet and outlet and a plurality of refrigerant flow paths that are communicated with the refrigerant inlet and outlet, and the cooling member includes the thermoelectric modules.

The refrigerant flow paths may include a plurality of cooling lines whose one ends are connected to the refrigerant inlet and the other ends are connected to the refrigerant outlet, and the substrate processing apparatus may further include flow rate control valves respectively provided on the cooling lines and a controller connected to the flow rate control valves to control them. In addition, a mesh may be provided at the refrigerant inlet.

One or more embodiments described herein may therefore achieve the following effects. First, the temperature of the inside of the chamber, and particularly the temperature of the upper or lower electrode, can be precisely controlled. Second, the temperature distribution of the upper or lower electrode can be made uniform.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A substrate processing apparatus, comprising:
   a chamber having an upper wall, at least one side wall and a lower wall; and
   an electrode member provided in the chamber to generate plasma, wherein the electrode member comprises:
   an electrode plate,
   a support die to support the electrode plate, the support die including a plurality of through-holes,
   a plurality of thermoelectric modules, each having a first surface coupled to a bottom surface of the electrode plate and a second surface facing the lower wall of the chamber,
   a plurality of fins inserted through respective ones of the through-holes and coupled between the electrode plate and respective ones of the thermoelectric modules, and
   a seal, provided at an edge of the bottom surface of the electrode plate, to shield the plurality of thermoelectric modules from the plasma generated in the chamber.

2. A substrate processing apparatus, comprising:
   a chamber having an upper wall, at least one side wall, and a lower wall; and
   an electrode member provided in the chamber to generate plasma,
   wherein the electrode member comprises:
   an electrode plate, a cooling plate, coupled to the electrode plate;
   at least one refrigerant flow path, coupled to the cooling plate, to direct refrigerant between an inlet and an outlet, the refrigerant flow path including a plurality of cooling lines having first ends coupled to the inlet and second ends coupled to the outlet;
   at least one flow rate control valve coupled to the refrigerant flow path;
   a controller configured to control the at least one flow rate control valve; and
   at least one thermoelectric module to control a temperature of the cooling plate,
   wherein the at least one thermoelectric module is thermal conductively coupled to the at least one refrigerant flow path directing the refrigerant between the inlet and outlet.

3. The substrate processing apparatus of claim 2, further comprising a mesh provided at the inlet.

4. The substrate processing apparatus of claim 2, wherein the at least one thermoelectric module is provided on the at least one refrigerant flow path directing the refrigerant between the inlet and outlet.

\* \* \* \* \*